US006806515B2

United States Patent
Hsiao et al.

(10) Patent No.: US 6,806,515 B2
(45) Date of Patent: Oct. 19, 2004

(54) LAYOUT OF A DECODER AND THE METHOD THEREOF

(75) Inventors: Chuan-Cheng Hsiao, Chiai (TW); Lin-Kai Bu, Tainan (TW); Kun-Cheng Hung, Hsinchu (TW); Chien-Pin Chen, Yangkang (TW)

(73) Assignee: Himax Technologies, Inc.

( * ) Notice: Subject to any disclaimer, the term of this patent is extended or adjusted under 35 U.S.C. 154(b) by 361 days.

(21) Appl. No.: 10/044,950

(22) Filed: Jan. 15, 2002

(65) Prior Publication Data

US 2002/0100925 A1 Aug. 1, 2002

(30) Foreign Application Priority Data

Jan. 18, 2001 (TW) ........................... 90101196 A

(51) Int. Cl.[7] ................. H01L 31/072; H01L 31/109; H01L 31/0328; H01L 31/0336
(52) U.S. Cl. ........................... 257/202; 257/208
(58) Field of Search ................ 257/202–211; 438/128, 129

(56) References Cited

U.S. PATENT DOCUMENTS 5,495,245 A * 2/1996 Ashe ................ 341/145
5,962,881 A * 10/1999 Young ............... 257/208

FOREIGN PATENT DOCUMENTS

| EP | 1 014 334 A2 | 6/2000 |
| EP | 1 014 334 A3 | 10/2000 |
| JP | 11-136130 | 5/1999 |

OTHER PUBLICATIONS

"Optimized Device and Decoder for an 8–Bit Resistive DAC"; IBM Technical Disclosure Bulletin, IBM Corp., vol. 31 No. 4, Sep. 1988; pp. 92–94.

"A 6–Bit Digital Data Driver for Color TFT–LCDs"; NEC Research and Development, Saito et al., vol. 36 No. 4, Oct. 1995; pp. 485–492.

* cited by examiner

*Primary Examiner*—Cuong Nguyen
(74) *Attorney, Agent, or Firm*—Rabin & Berdo, P.C.

(57) ABSTRACT

A layout structure of a decoder with m*n nodes and the method thereof are provided. The nodes comprise a plurality of transistor nodes and a plurality of channel nodes. The manufacturing method of the transistor node comprises forming a gate, a first source/drain region and a second source/drain region. The channel node is fabricated by forming a channel. The channel, the first source/drain region and the second source/drain region are formed at the same time with the same material. The decoder circuit with smaller width is accomplished without additional mask in the invention.

9 Claims, 14 Drawing Sheets

US 6,806,515 B2

LAYOUT OF A DECODER AND THE METHOD THEREOF

This application incorporates by reference Taiwanese application Serial No. 90101196, filed on Jan. 18, 2001.

BACKGROUND OF THE INVENTION

1. Field of the Invention

This invention relates to a layout of a decoder and the method thereof, particularly to the layout of a decoder and the method with fewer masks and smaller circuit width.

2. Description of the Related Art

A LCD (Liquid Crystal Display) has a data driver and a scan driver. Colors or images on the display are transformed by the following mechanism. First, one of the scan lines, which are needed to be scanned, is determined by the scan driver. Then, all the pixels in one of the scan lines are updated by inputting data signals from the data driver. Take the color TFT LCD (thin film transistor LCD) for example, each pixel includes three sub-pixels wherein the gray scale of each sub-pixel is controlled by a TFT (Thin Film Transistor). The three sub-pixels represent three colors of red, green and blue, respectively. Therefore, color of each pixel is controlled by three TFTs.

FIG. 1 shows the structure of driving circuit for a color TFT LCD 100. When the resolution of the color LCD is achieved by 1280 pixels×1024 lines, 3840 (1280×3) sub-pixels as well as TFTs for each scan line are required. Firstly, the data driver 106 receives digital image data D and transfers digital image data D to analog image data by DAC 108 (Digital to Analog Converter, D/A). Then, the scan driver 104 selects scan line 114 (m) and the data of the sub-pixel on scan line(m) is updated through the data line 112 from the data driver 106.

In the LCD, each sub-pixel contains liquid crystal to decide transmittance thereof and the transmittance is controlled by the voltage applied to the liquid crystal. If the voltage with the same polarity is constantly applied to the sub-pixel, liquid crystal will be easily damaged. The transmittance of each sub-pixel is related to the value of the applied voltage, not the polarity of the applied voltage. Therefore, the damage problem can be solved by polarity inversions.

FIG. 2 shows the circuit block diagram according to the DAC 108 in FIG. 1. DAC 108 comprises a plurality of P-type DAC unit 202, a plurality of N-type DAC unit 204, a plurality of buffer unit 206, switch units 210 and 212. The P-type DAC unit 202 includes a plurality of PMOS (P-type Metal-Oxide-Semiconductor), and the N-type DAC unit 204 includes a plurality of NMOS (N-type Metal-Oxide-Semiconductor). These P-type and N-type DAC units are arranged alternately, and they are used for outputting different voltage levels. As the digital image data D of a scan line is inputted to the DAC unit 108, the digital data D(n) for each sub-pixel is selected by the switch unit 210, according to the dot inversion method or column inversion method, to input to the P-type DAC unit 202 or N-type DAC unit 204. If the digital data D(n) is inputted to the P-type DAC unit 202, the digital data D(n) will be transferred to an analog signal Vp. If the digital data D(n) is inputted to the N-type DAC unit 202, the digital data D(n) will be transferred to an analog signal Vn. Thereafter, the analog signal Vp and Vn are inputted to the buffer unit 206 and the output signal Vp' and Vn' are produced, respectively. Next, the switch unit 212 outputs these output signal Vp' and Vn' to one of the data lines according to the method used by switch unit 210. For the skilled in the art, it is well known that the analog signal Vp' and Vn' are the voltage with different polarity.

FIG. 3 shows the circuit diagram of N-type DAC unit 204 in FIG. 2. Herein, the input of 3-bit is illustrated, and the digital data D(n) of 3-bit is provided. N-type DAC unit 204 comprises a resistor string Rs, an output line OUT and a decoder 302. The two ends of the resistor string Rs are respectively connected to the voltage Vc and Vd. The resistor string Rs is composed of R0 to R6 which are connected in series. Therefore, 8 kinds of different voltage level from V(0) to V(7) are provided.

Decoder 302 is composed of a plurality of transistor node 310 and a plurality of channel node 320 in the array arrangement. The gate of transistor in each column of the transistor node 310 are connected with each other, and thereby the decoder inputs of B(0) to B(5) are produced. The source/drain of transistor Q in each row of the transistor node 310 and the channel node 320 are connected in series, and thereby the signal lines L(0) to L(7) are formed.

Please refer to FIG. 4A and FIG. 4B at the same time. They show the circuit diagram of the transistor node 310 which contains a transistor Q and the circuit diagram of the channel node 320 which contains a connection line K, respectively. The decoder inputs B(0) to B(5) are used to receive the digital data D(n). The digital data D(n) b0', b0, b1', b1, b2', b2 are inputted to the decoder input B(5) to B(0), respectively, wherein b0, b1, b2 are inverse of b0', b1', b2'. The input ends of the signal lines L(0) to L(7) are coupled with the output ends of the resistor string Rs. All of the output ends of the signal lines L(0) to L(7) are commonly connected to the output line OUT. Output line OUT is used to output the analog signal while the digital data are processed by the digital-to-analog conversion. The voltages V(0) to V(7) outputted from the resistor string Rs are inputted to the signal lines L(0) to L(7). The gates of the transistors on the signal lines L(i) are controlled by the decoder input B. When the transistors on the signal line L(i) are conducted, the output line OUT outputs voltage V(i). Meanwhile, only the transistors on the output line OUT are conducted, and only the input ends and the output ends on the signal line L(i) are conducted, wherein the 0←i←7. For example, as the digital data D(n) is 000,—all of b0', b1' and b2' are 1, only the transistors on the signal line L(0) are conducted. Therefore, the output line OUT outputs the analog signal Vn of voltage V(0).

FIG. 5 shows the layout of the decoder 302 in FIG. 3 according to the conventional method. The layout of each transistor node 310 for the decoder 302 comprises a gate 530, a source region 532 and a drain region 534, which correspond to a transistor area. Other than the gate 530, the source region 532 and the drain region 534, the layout of the channel node 320 further comprises a doped layer 526, which forms a short circuit between the source region 532 and the drain region 534 of the channel node 320, and make the transistor always conduct. The channel node 320 corresponds to a channel area. FIG. 6A to FIG. 6E show manufacturing method for the signal line L(0) in FIG. 5. The manufacturing process for the decoder 302 is as following. As show in FIG. 6A, a substrate 624 is provided. Then, a doped layer 526 is formed in the channel area as shown in FIG. 6B. Next, the transistors are formed in whole transistor nodes 310 and whole channel nodes 320 of the decoder 302, which corresponds to FIG. 6C to FIG. 6E. In FIG. 6C, an oxide layer 628 is formed on the substrate 624. As shown in FIG. 6D, a plurality of gates 530 are formed on the oxide layer 628, and the source region 532 and drain region 534 are formed in the substrate 624 in FIG. 6E. These gates 530 are connected to the decoder input B and the transistors are shorted because there is a doped layer 526 in the channel node 320. In this manner, the transistors are conducted and are not controlled by the decoder input B. Because the DAC 108(n) includes P-type DAC unit 202 and N-type DAC unit 204, it is necessary to form the P-type doped layer and N-type doped layer independently with two additional masks.

FIG. 7 shows the layout of the decoder 302 in FIG. 3 according to another conventional method. The decoder 302 is composed of a plurality of transistor nodes 310 and a plurality of channel nodes 320 in the array arrangement. The layout of each transistor node 310 for the decoder 302 comprises a gate 730, a source region 732 and a drain region 734, which correspond to a transistor area. Other than the gate 730, the source region 732 and the drain region 734, the layout of the channel node 320 further comprises a short-circuited device 736, which causes a short circuit between the source region 732 to the drain region 734 for the channel node 320. The channel node 320 corresponds to a channel area. FIG. 8A to FIG. SE show the manufacturing method for the signal line L(0) in FIG. 7. The process for forming transistors in whole transistor nodes and channel nodes of the decoder 302 is as follows. As shown in FIG. 8A, a substrate 824 is provided. Then, an oxide layer 828 is formed on the substrate 824, as shown in FIG. 8B. Next, a plurality of gates 730 is formed on the oxide layer 828 as shown in FIG. 8C. In FIG. 8D, the source region 732 and drain region 734 are formed in the substrate 824 and the layout of the transistor is finished. Referring to FIG. 8E, an insulating layer 838 is formed on the substrate 824 and a short-circuited device 736 is defined in the channel area by forming a metal layer on the insulating layer 838. The first contact 740 and the second contact 742 of the short-circuited device 736 penetrate through the insulating layer 838 and connect to the source region 732 and drain region 734, respectively. Therefore, a short circuit is formed between the source 732 and drain 734. Moreover, the gate 730 is connected to the decoder input B and the transistor is always conducted. Since the short-circuited device 736 connects to the source 732 and drain 734 of the transistor in the channel area, the transistor is not controlled by any one of the decoder input B.

Although such conventional method doesn't have the step of forming a doped layer with additional masks—the P-type and N-type, the circuit width of the DAC unit is increased because the connection between the short-circuited device 736 and the source 732, drain 734 is completed by the contacts. In addition, if 10 data drivers are used in a panel, there are 384 DAC units in the data driver, which make the entire circuit width of the DAC units large. For the DAC unit with 6-bit, the later conventional method is difficult but can be implement. And this data driver will become too long to use if the DAC unit is of 8 bits.

SUMMARY OF THE INVENTION

The object of the present invention is to provide the layout of decoder and the method thereof wherein the decoder has smaller circuit width and is manufactured with reduced masks.

According to the purpose of the present invention, a decoder structure with m×n nodes is provided, and the nodes comprises a plurality of transistor nodes and a plurality of channel nodes. The transistor node N(i1, j1) corresponds to a transistor area A(i1 ,j1), and the channel node N(i2,j2) corresponds to a channel area A(i2,j2), wherein the i1, i2, j1 and j2 satisfy the relations of $1 \leq i1$, $i2 \leq m$, $1 \leq j1$, $j2 \leq n$, $i1 \neq i2$, $j1 \neq j2$. The decoder structure comprises a substrate, a first source/drain region, a second source/drain region, a channel, a first insulating layer, a gate, a second insulating layer and a metal layer. The first source/drain region and the second source/drain region are positioned on the substrate in the transistor area A(i1, j1). The channel on the channel area A(i2, j2) is disposed within the substrate. The first insulating layer covers the first source/drain region, the second source/drain region and the channel. The gate is disposed on the first insulating layer and between the first source/drain region and the second source/drain region. The second insulating layer covers the gate. The metal layer is positioned over the gate and electrically connects the gates in the same column to form a decoder input.

While the transistor node N(i1, j1) and the channel node N(i2, j2) are on the same row and connected to each other, the first source/drain region and the second source/drain region of said transistor area A(i1, j1) are connected to the channel of the channel area A(i2, j2).

While the transistor node N(i1, j1) is next to the transistor node N(i3, j3) on the same row, the first source/drain or the second source/drain of the transistor node N(i1, j1) is connected to the first source/drain or the second source/drain of the transistor node N(i3, j3).

While the channel node N(i2, j2) is in the proximity of the channel node N(i4, j4) on the same row, the channel of the channel node N(i2, j2) is connected with the channel of the channel node N(i4, j4).

One end of the nodes on the same column is for receiving a signal and the other end of the nodes connects to the data line, which is used to output the signal selectively. The metal layer is used to electrically connect the gates of the transistor nodes on the same column, and thereby forming Y decoder inputs to receive a digital signal data.

According to another purpose of the invention, a method for manufacturing the structure of the decoder is provided. The decoder comprises m signal lines, n decoder inputs, p transistor nodes and (m*n-p) channel nodes, wherein p is an integer smaller than m*n. First, a substrate is provided and an insulating layer is formed on the substrate. Then, p gates are formed on the transistor area. Next, p first sources/drain regions and p second sources/drain regions are formed on the transistor area, and, meanwhile, (m*n-p) channels are formed on the channel area to complete m signal lines. Afterwards, a second insulating layer is formed, and the decoder input is formed by depositing selectively patterning a metal layer. The decoder inputs electrically connect to the gates with a plurality of contacts.

BRIEF DESCRIPTION OF THE DRAWINGS

The above objects and other advantages of the present invention will become more apparently by describing in detail the preferred embodiment of the present invention with reference to the attached drawings in which.

DESCRIPTION OF THE PREFERRED EMBODIMENTS

Figure 1:
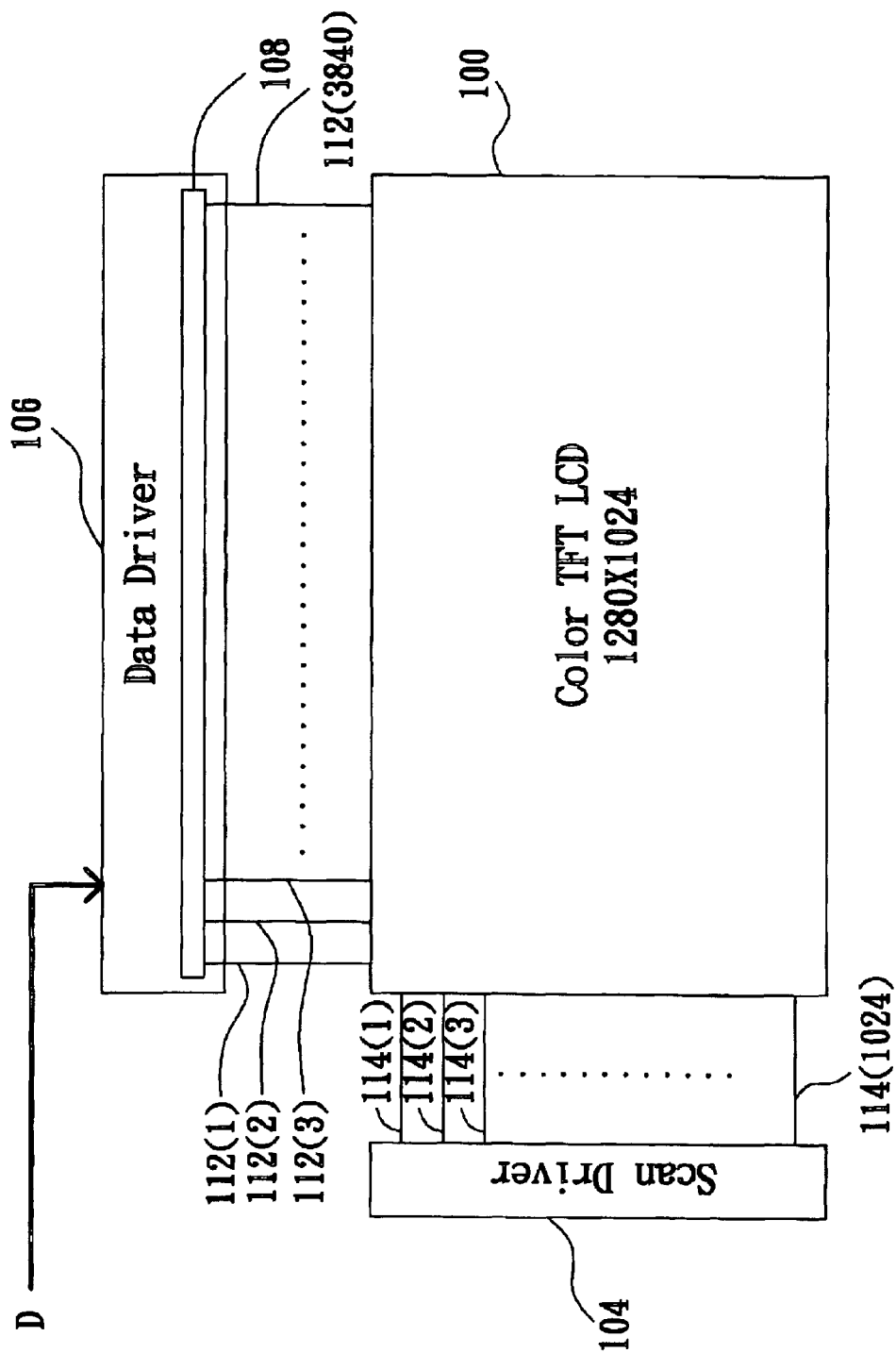
FIG. 1 shows a driving circuit for the color TFT LCD.
Figure 2:
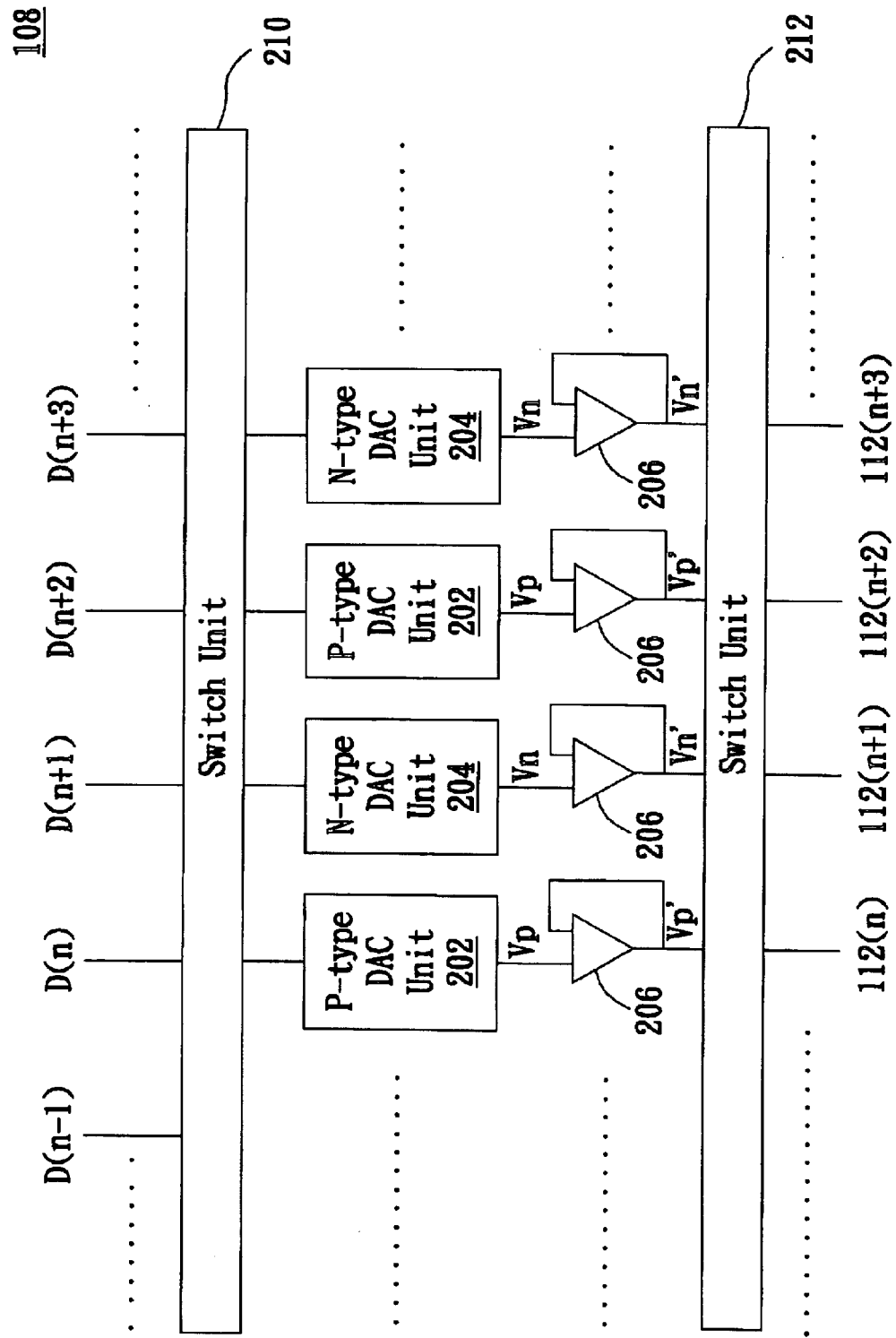
FIG. 2 shows a block diagram of the driving circuit of a DAC in FIG. 1.
Figure 3:
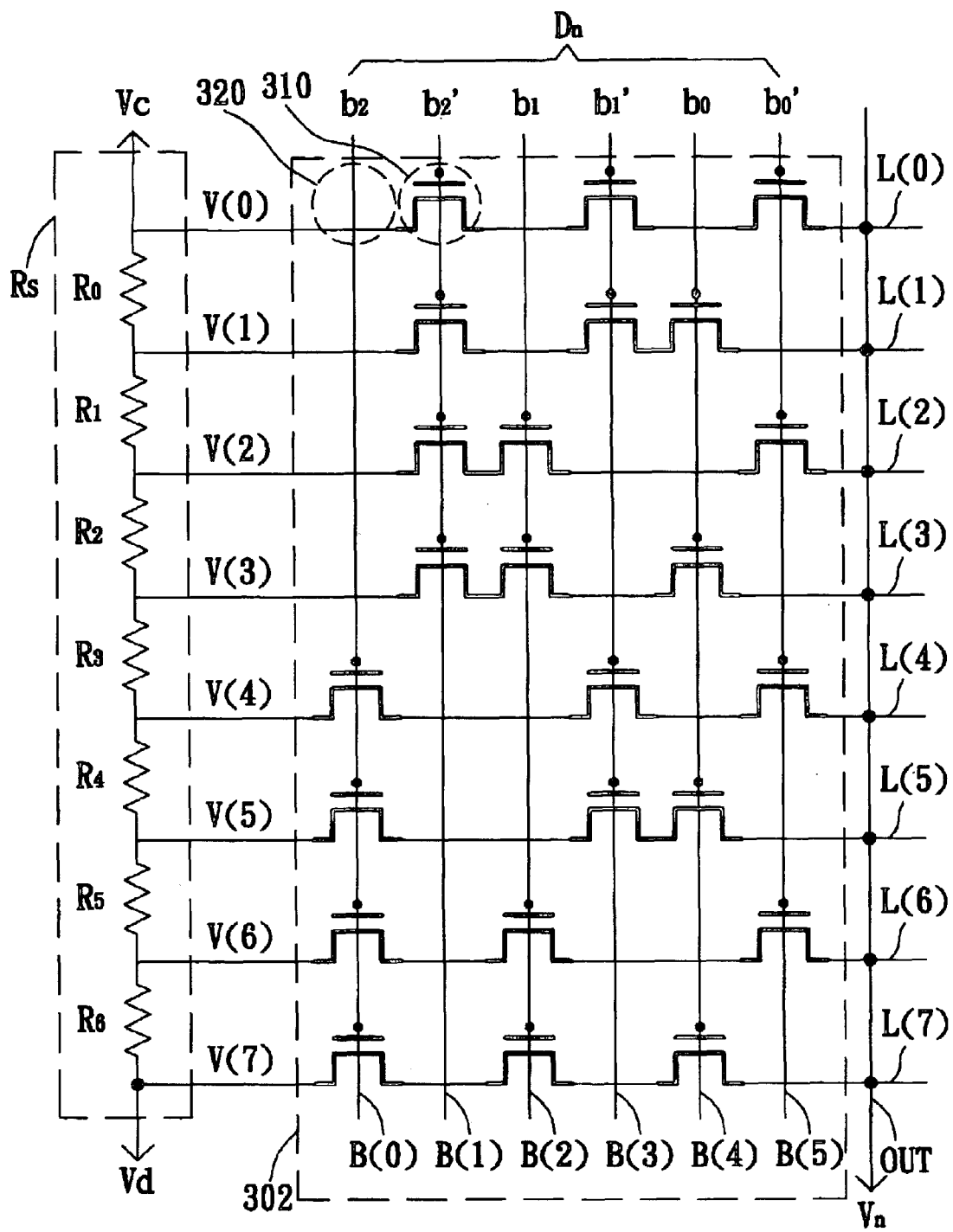
FIG. 3 shows a conventional circuit diagram of an N-type DAC unit in FIG. 2.
Figure 4A:
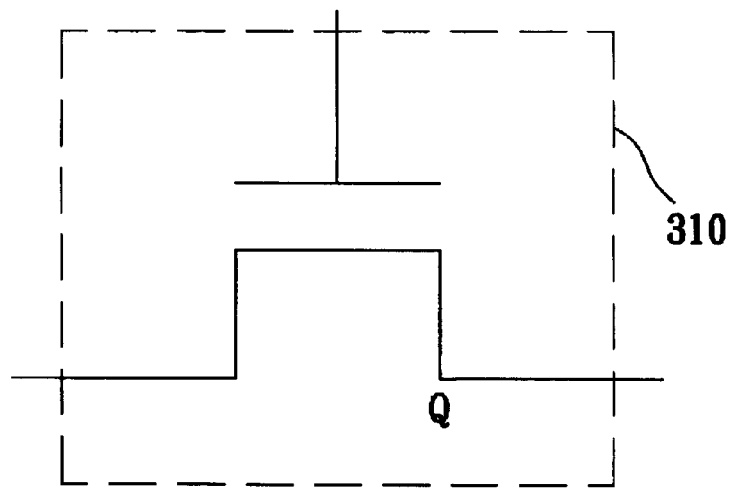
FIG. 4A shows a circuit diagram of the transistor node.
Figure 4B:
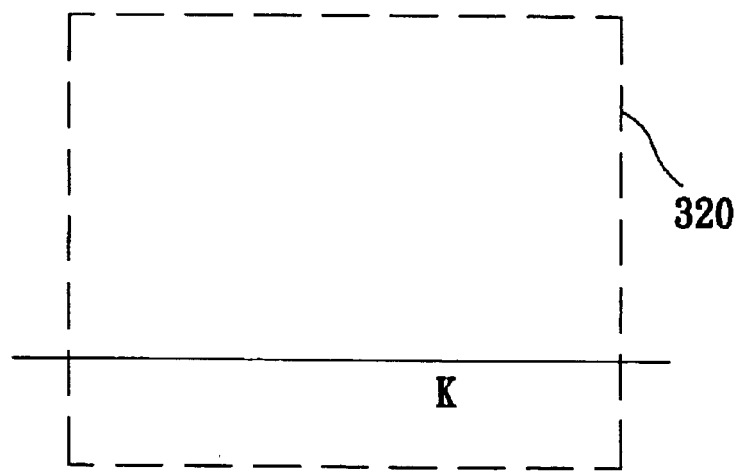
FIG. 4B shows a circuit diagram of the channel node.
Figure 5:
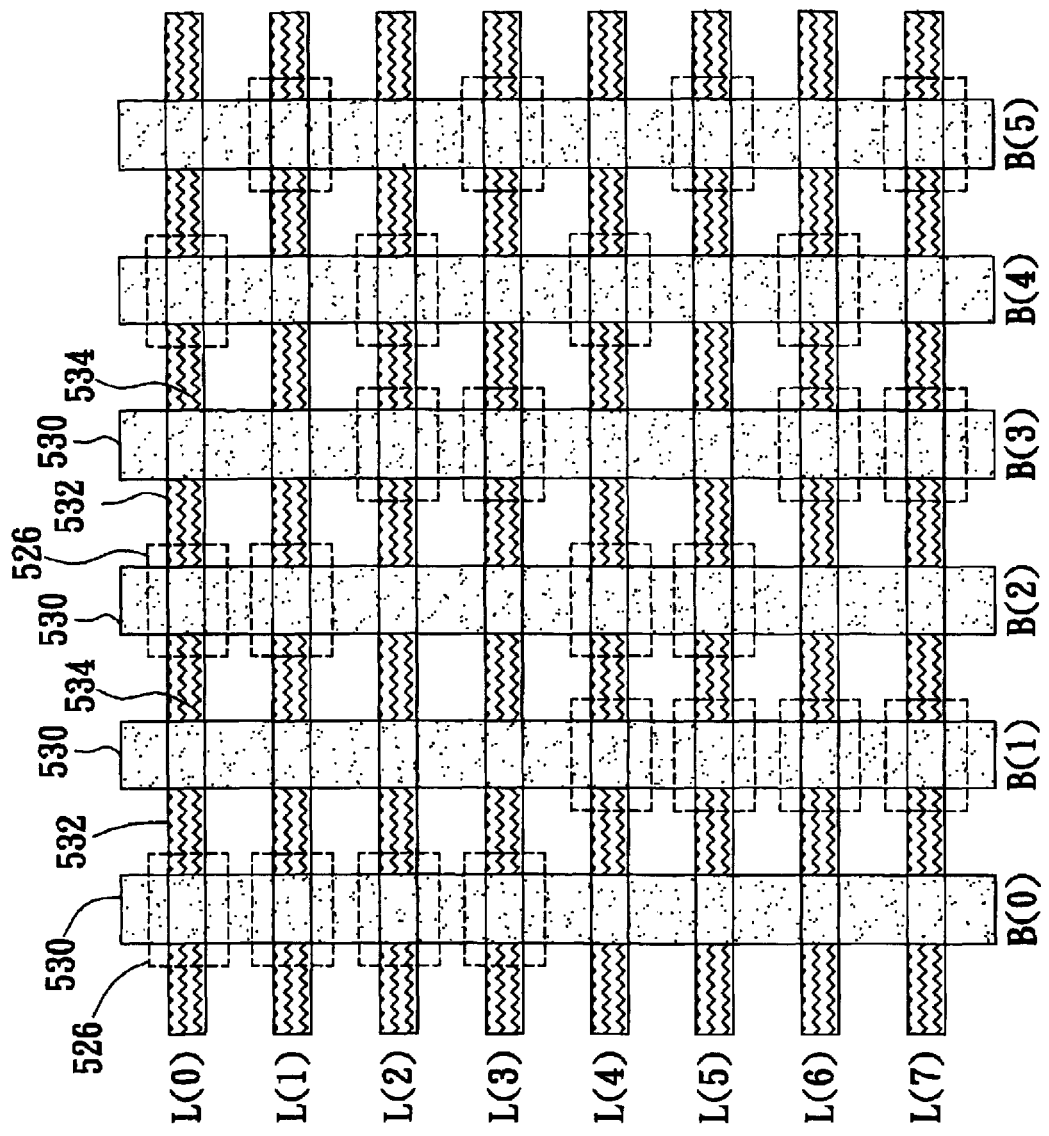
FIG. 5 shows a conventional layout of the decoder in FIG. 3.
Figure 6A:
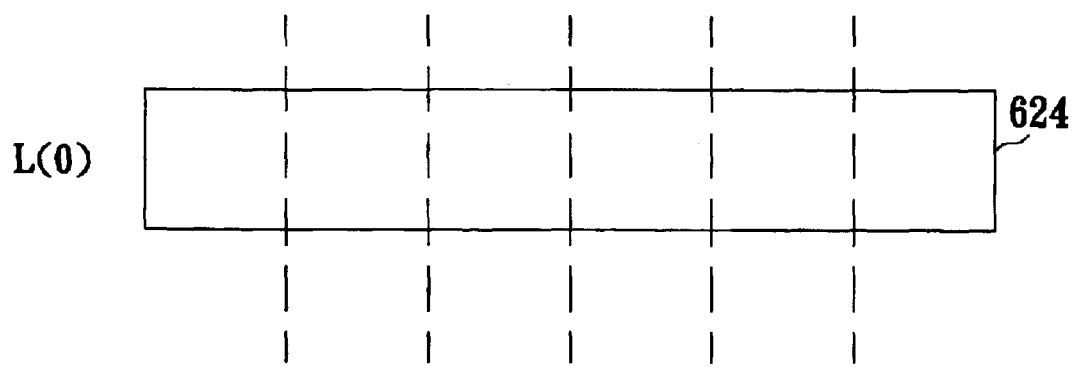
FIG. 6A to FIG. 6E show cross-sectional view illustrating manufacture of the signal line L(0) in FIG. 5.
Figure 6B:
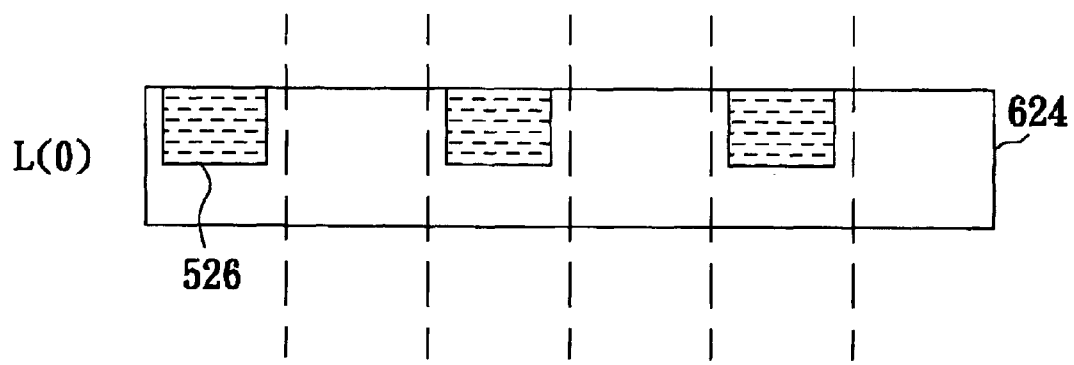
Figure 6C:
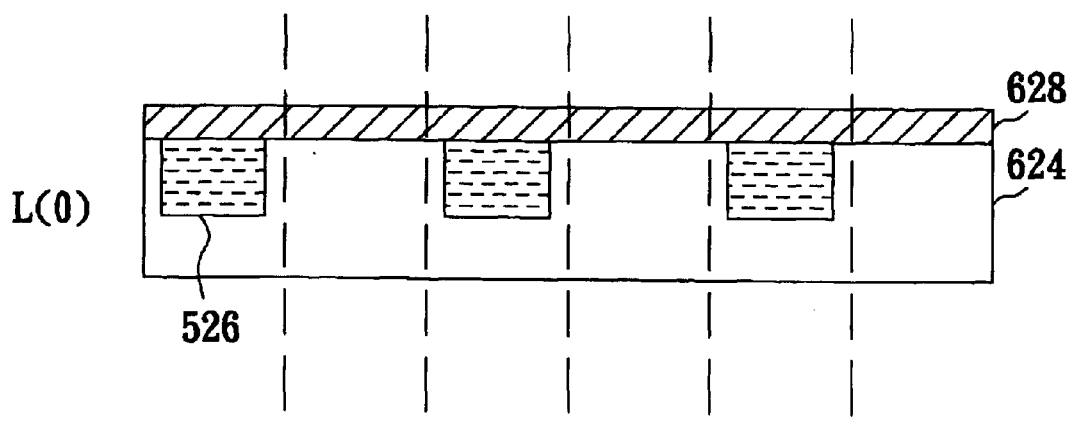
Figure 6D:
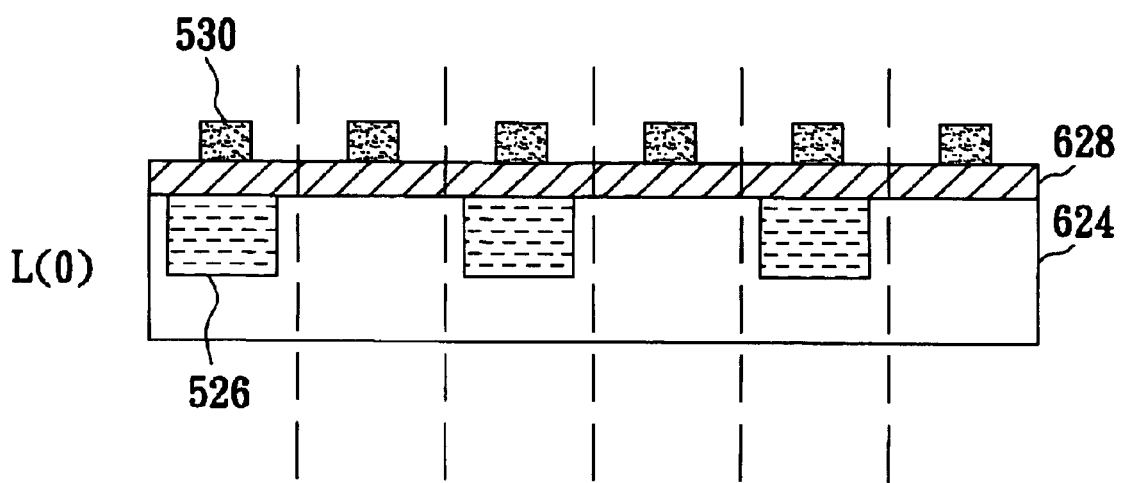
Figure 6E:
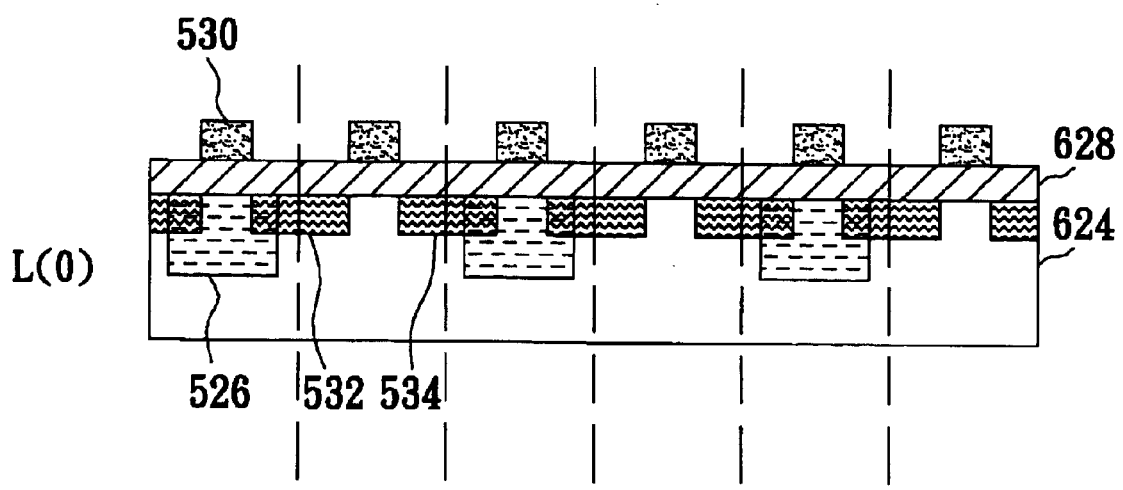
Figure 7:
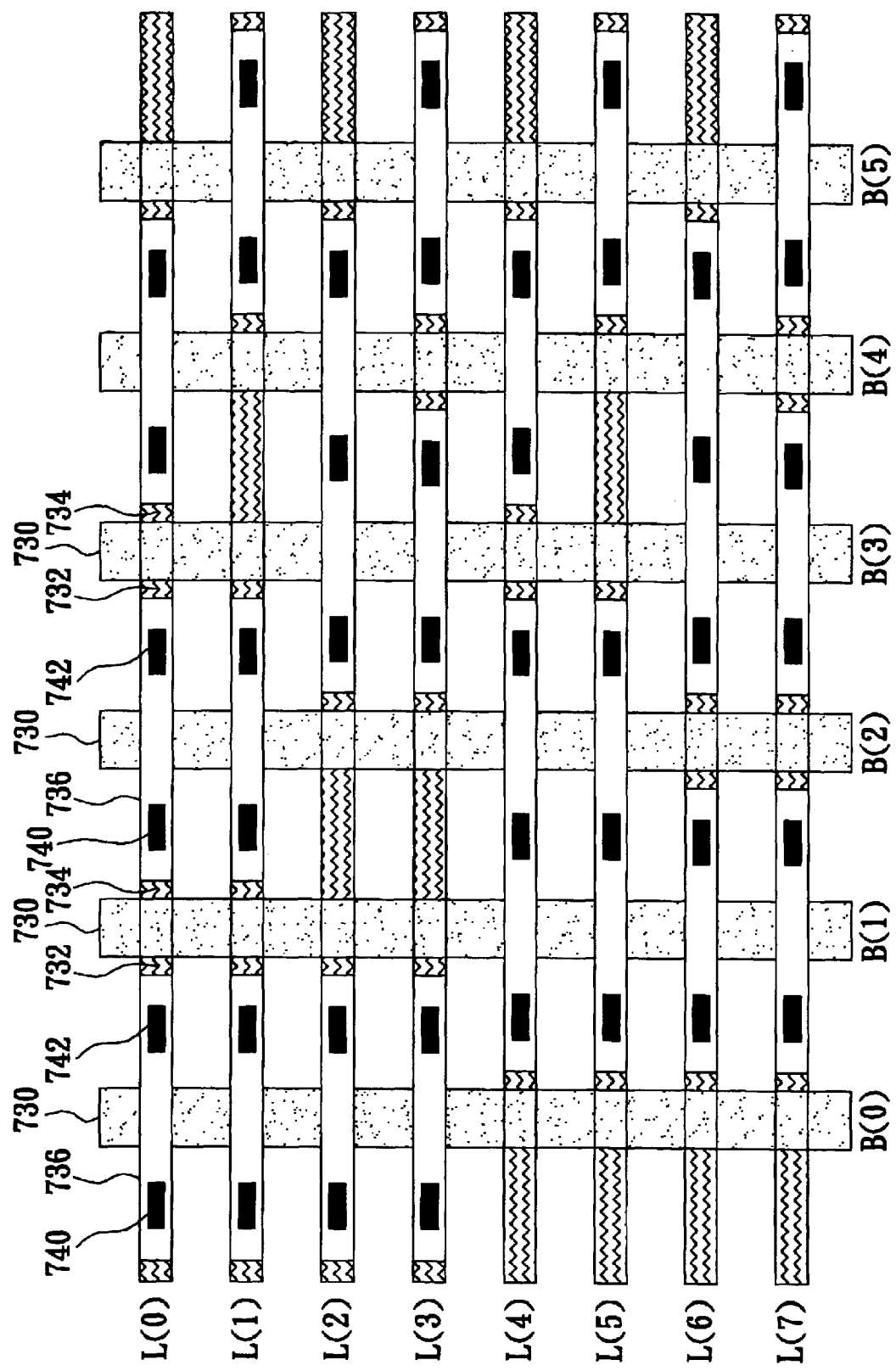
FIG. 7 shows another conventional layout of the decoder in FIG. 3.
Figure 8A:
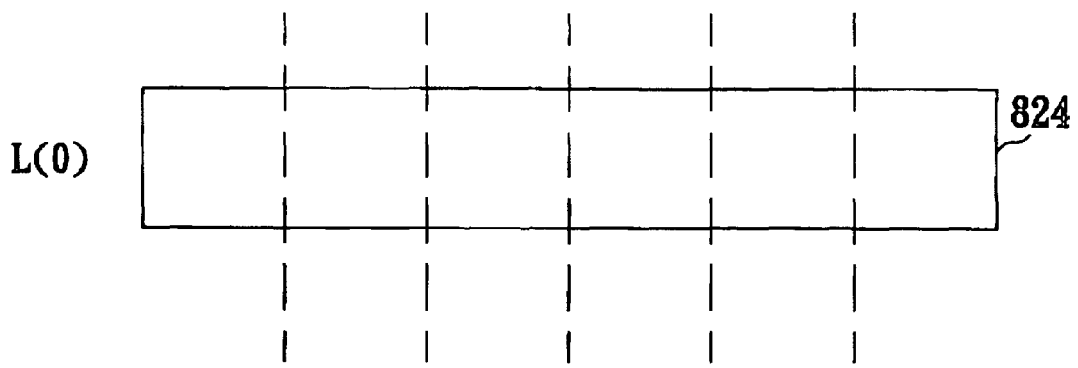
FIG. 8A to FIG. 8E show cross-sectional view illustrating manufacture of the signal line L(0) in FIG. 7.
Figure 8B:
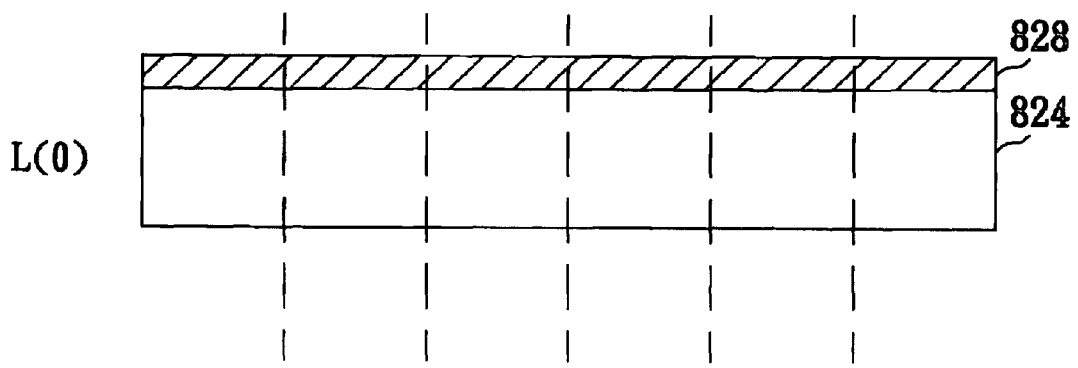
Figure 8C:
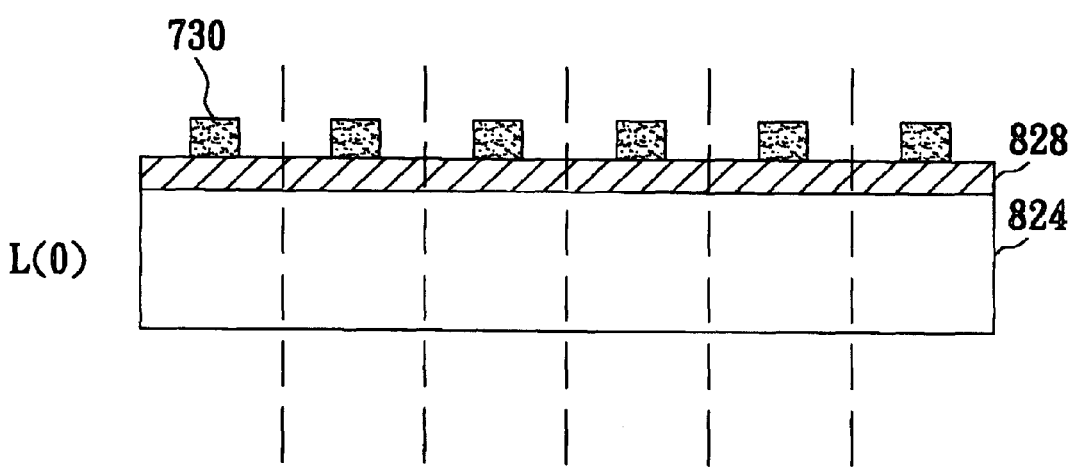
Figure 8D:
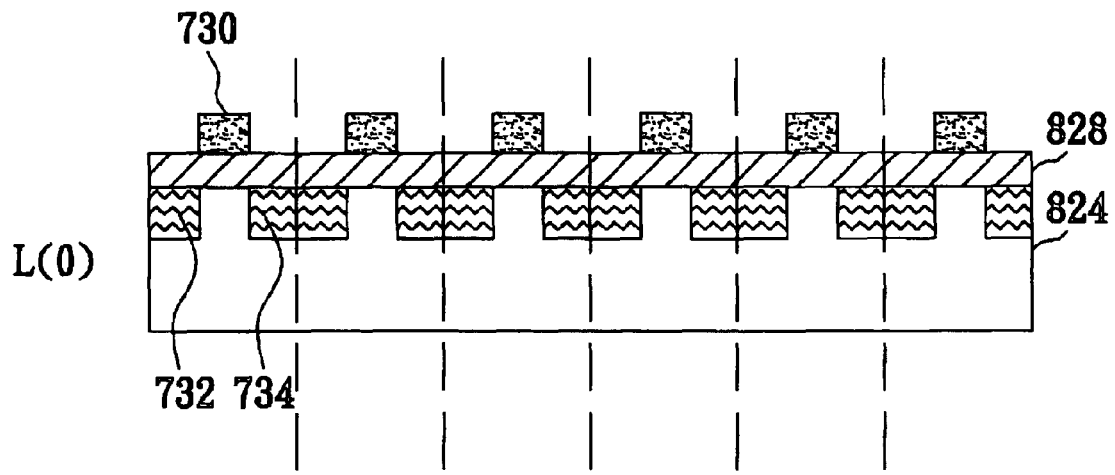
Figure 8E:
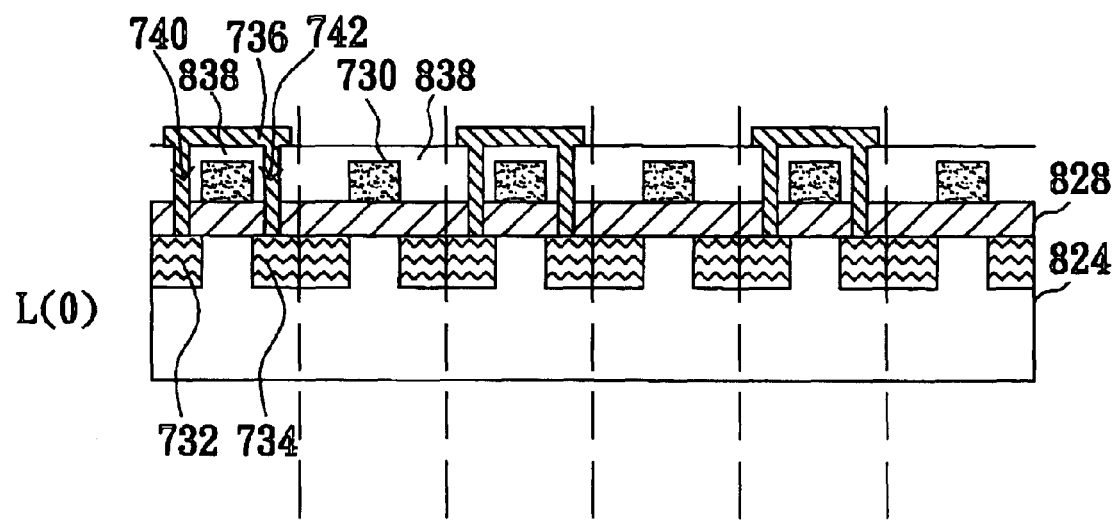
Figure 9A:
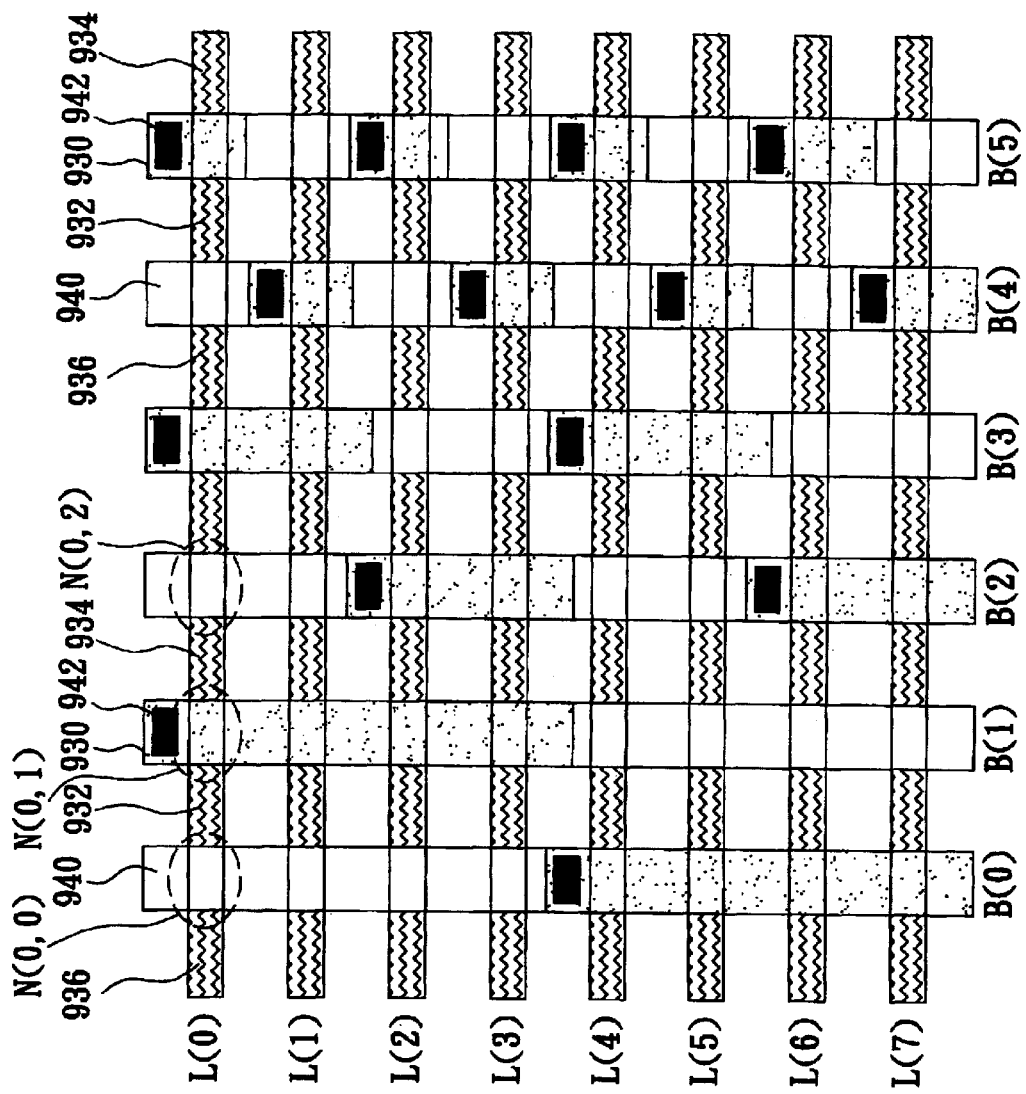
FIG. 9A shows the layout of the decoder in FIG. 3 according to a preferred embodiment of the present invention.

As shown in FIG. 9A, it illustrates a layout of the decoder 302 in FIG. 3 according to a preferred embodiment in the present invention. The decoder 302 comprises 8*6 nodes, and each node contains a plurality of transistor nodes 310 and a plurality of channel nodes 320, which, respectively, correspond to a transistor area and a channel area. The layout of each transistor node 310 comprises a gate, a source and a drain. The channel node 320 contains a channel. The gates on the same column of the transistor node are connected to each other so that decoder input B(0) to B(5) are formed. The transistor nodes and the channel nodes on each row are connected in series and thus the signal line L(0) to L(7) are formed.

Figure 9B:
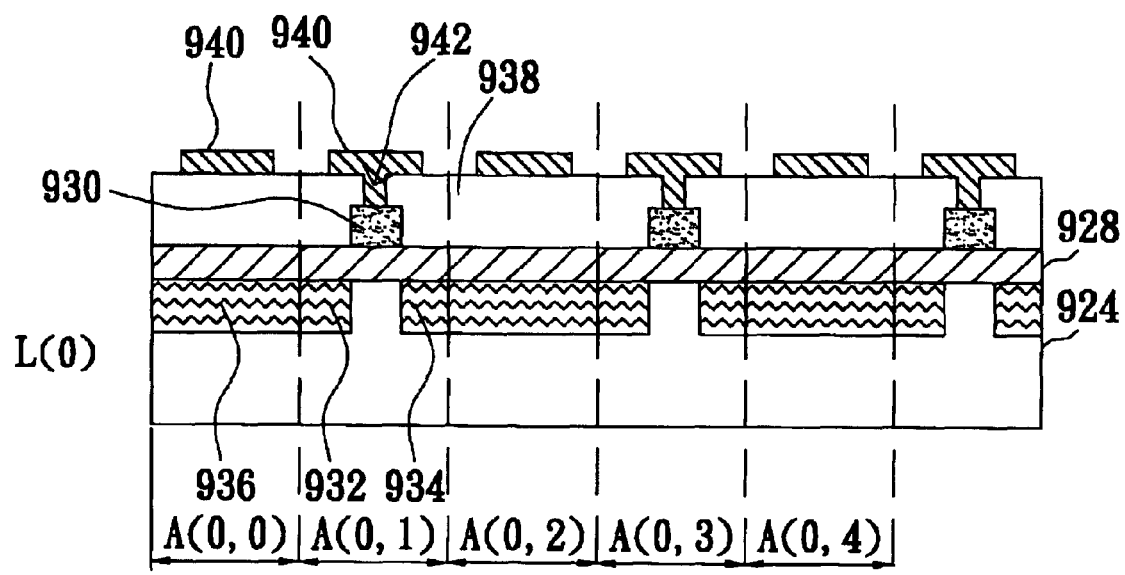
FIG. 9B shows the sectional view of the signal line L(0) in FIG. 9A.

FIG. 9B shows cross-sectional view of the signal line L(0) in FIG. 9A. The signal line L(0) comprises a substrate 924, a first source/drain region 932, a second source/drain region 934, a channel region 936, a first insulating layer 928, a gate 930, a second insulating layer 938 and a metal layer 940. The first source/drain region 932 and the second source/drain region 934 are positioned within the substrate 924 in the transistor area A(0,1), A(0,3) and A(0,5). The channel 936 is disposed within the substrate 924 in the channel area of A(0,0), A(0,2) and A(0,4). The first source/drain region 932, the second source/drain region 934 and the channel 936 are covered with the first insulating layer 928. The gate 930 formed on the first insulating layer 928 is disposed between the first source/drain region 932 and the second source/drain region 934. Furthermore, the gate 930 is covered with the second insulating layer 938, and the metal layer 940 formed on the second insulating layer 938 is electrically connected to the gate 930.

The transistor node N(0,1) and the channel node N(0,0) on the same row are connected to each other in the proximity. The first source/drain 932 region is connected to the channel of the channel area A(0,0). The gates 930 of the transistor node on the same column are electrically connected to each other by the metal layer 940, and, accordingly, six decoder inputs are formed to receive the data signal D(n).

Figure 10A:
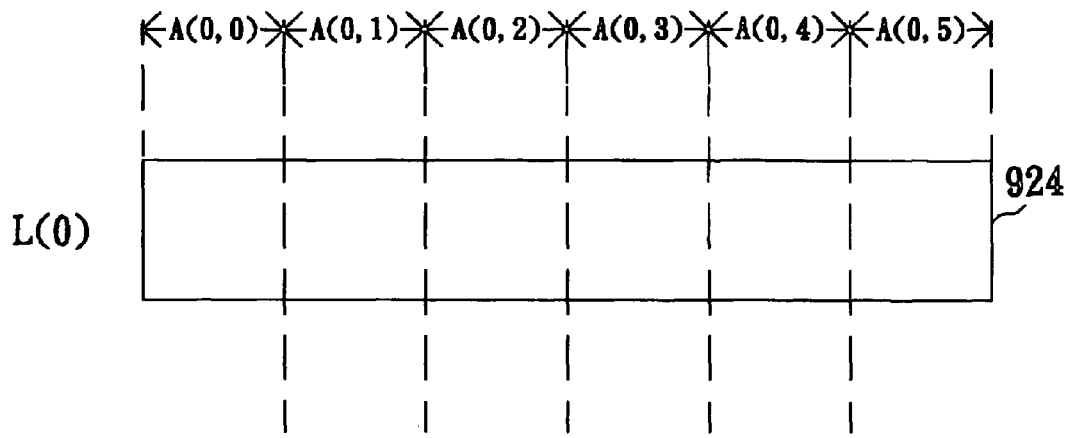
FIG. 10A to FIG. 10E show cross-sectional view illustrating manufacture of the signal line L(0) of the decoder according to the preferred embodiment of the present invention.

The transistor node 310 in the present invention is manufactured using conventional processes. The gate 930, the first source/drain region 932 and the second source/drain region 934 are sequentially formed. The fabrication of the channel node 320 is completed by the step of forming a channel. Without additional mask, the channels 936, the first source/drain region 932 and the second source/drain region 934 are formed simultaneously. FIG. 10A to FIG. 10E are cross-sectional view of manufacturing the signal line L(0) of the decoder 302 according to the preferred embodiment of the invention. In FIG. 10A, a substrate 924 is provided.

Figure 10B:
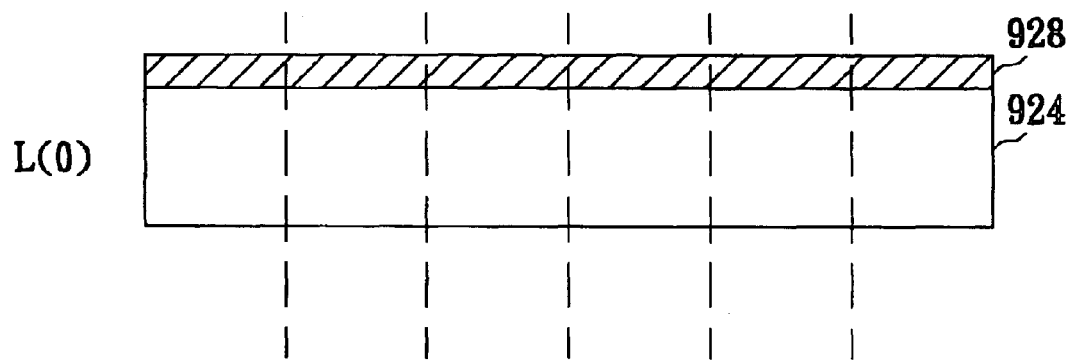
Figure 10C:
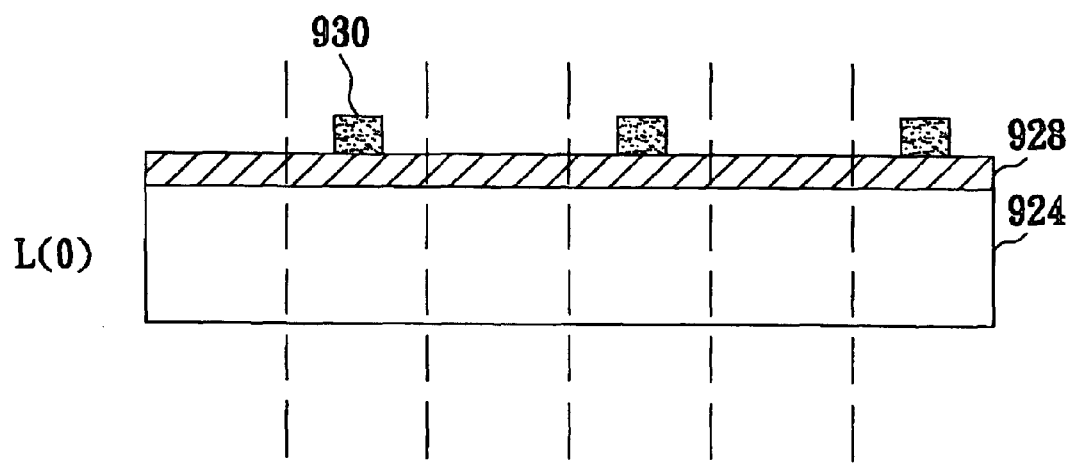
Figure 10D:
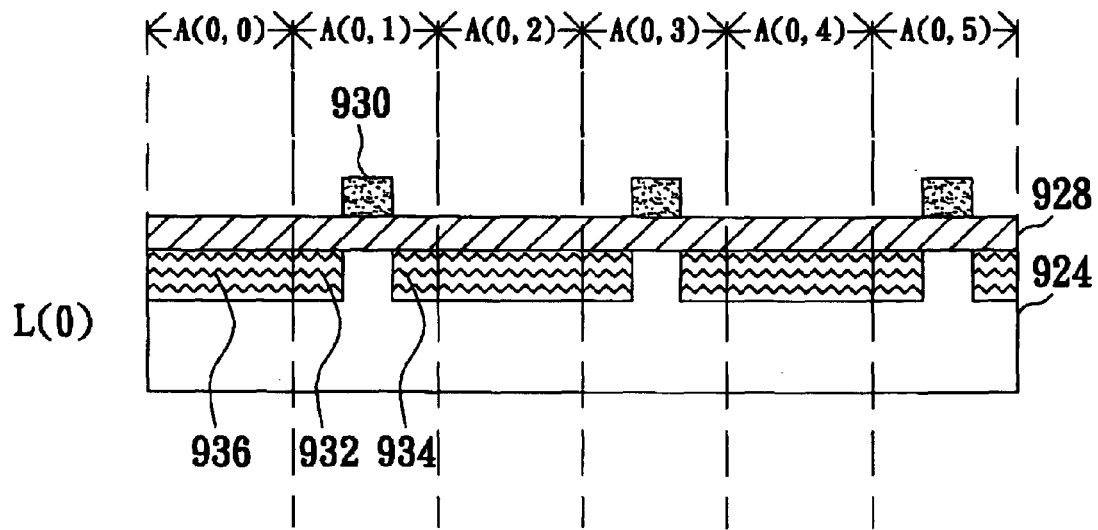
Figure 10E:
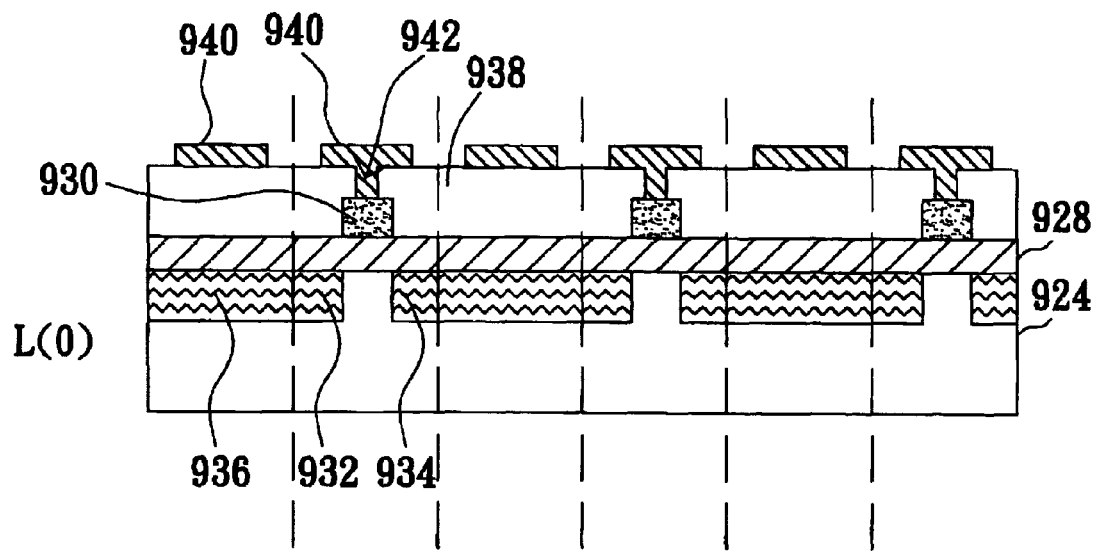

Then, an insulating layer 928 is formed on the substrate 924, and a plurality of gates 930 are formed in the transistor area A(0,1), A(0,3) and A(0,5), as shown in FIG. 10B and 10C. Referring to FIG. 10D, the channels 936 are formed within the substrate 924 directly in the A(0,0), A(0,2) and A(0,4) because no gate covers the channel area A(0,0), A(0,2) and A(0,4). Therefore, the signal line L(0) to L(7) are formed. Meanwhile, the channels of the channel area A(0,0), A(0,2) and A(0,4) are electrically connected with the first source/drain region 932 or the second source/drain region 934 of the transistor area A(0,1), A(0,3) and A(0,5), respectively. Then, referring to FIG. 10E, a metal layer 940 is formed over the substrate 924 and is patterned to form the decoder input B(0) to B(5), which are electrically connected with the gates 930 on the same column by a plurality of contacts 942.

Since the channel of the channel area and the source/drain region of the transistor area are formed simultaneously in the invention, it is not necessary to add the P-type and N-type channel as the conventional method. Hereby, two masks are reduced in the invention. Moreover, the circuit width of the present invention is decreased without the formation of the short by metal layer. Therefore, the decoder layout of the smaller circuit width is accomplished without additional mask.

Once given the above disclosure, many other features, modifications, and improvement will become apparent to the skilled artisan. Such other features, modifications, and improvements are, therefore, considered to be a part of this invention, the scope of which is to be determined by the following claims.

What is claimed is:

1. A decoder structure with m*n nodes, each of said nodes comprising a plurality of transistor nodes and a plurality of channel nodes, one of said transistor nodes N(i1, j1) corresponding to a transistor area A(i1,j1), and one said channel nodes N(i2,j2) corresponding to a channel area A(i2,j2), wherein $1 \leq i1$, $i2 \leq m$, $1 \leq j1$, $j2 \leq n$, $i1 \neq i2$, $j1 \neq j2$, said decoder structure comprising:

a substrate;

a first source/drain region and a second source/drain region formed within said substrate in said transistor area A(i1, j1);

a channel formed within said substrate in said channel area A(i2, j2);

a first insulating layer formed on said first source/drain region, said second source/drain region and said channel;

a gate formed on said first insulating layer between said first source/drain region and said second source/drain region;

a second insulating layer formed on said gate; and a metal layer formed over said gate and electrically connected with said gate;

wherein when said transistor node N(i1, j1) is next to said channel node N(i2, j2) on the same row, one of said first source/drain region and said second source/drain region of said transistor area A(i1, j1) is connected with said channel of said channel area A(i2, j2);

when said transistor node N(i1, j1) is next to said transistor node N(i3, j3) on the same row, one of said first source/drain region and said second source/drain region of said transistor node N(i1, j1) is connected with said one of first source/drain region and said second source/drain region of said transistor node N(i3, j3);

when said channel node N(i2, j2) is next to said channel node N(i4, j4) on the same row, said channel of said channel node N(i2, j2) is connected with said channel of said channel node N(i4, j4); and said metal layer electrically connecting said gates of said transistor nodes on the same column to form a plurality of decoder input for receiving digital signal data.

2. The decoder structure of claim 1, wherein said first insulating layer is an oxide layer.

3. A decoder structure with a plurality of transistor nodes and a plurality of channel nodes, one of said transistor nodes corresponding to a transistor area and one of said channel nodes corresponding to a channel area, said decoder structure comprising:

a substrate;

a transistor disposed in said transistor area, said transistor comprising a gate, source/drain regions, said source/drain regions formed within said substrate beside said gate;

a metal layer disposed on said gate and insulated with said substrate;

a channel formed within said substrate in said channel area;

when a first transistor node of said transistor nodes is connected to a first channel node of said channel nodes on the same row, one of said source/drain regions of said transistor area is connected with said channel of said channel area;

when said first transistor node of said transistor nodes is connected to a second transistor node of said transistor nodes on the same row, one of source/drain regions of said first transistor node is connected with one of source/drain regions of said second transistor node;

when said first channel node is connected to a second channel node of said channel nodes on the same row, said channel of said first channel node is connected with said channel of said second channel node; and said metal layer electrically connecting said gates of said transistor nodes on the same column by at least one contact to form a plurality of decoder input for receiving digital signal data.

4. The decoder structure of claim 3 further comprising a first insulating layer between said gate and said substrate to electrically insulate said gate and said substrate.

5. The decoder structure of claim 3 further comprising a second insulating layer between said metal layer and said substrate to insulate said metal layer and said substrate.

6. The decoder structure of claim 3, wherein said channel area on said substrate does not comprises said gate of said transistor.

7. The decoder structure of claim 3, wherein said metal layer in said channel area is electrically insulated with said channel area.

8. A decoder structure with m*n nodes, where m and n are positive integers, said m*n nodes comprising p transistor nodes and (m*n-p) channel nodes, p being an integer smaller than m*n, said transistor nodes corresponding to a transistor area, said channel nodes corresponding to a channel area, said decoder structure comprising:

a substrate;

p transistor nodes formed on said transistor area, said p transistor nodes including p gates, p first sources/drains and p second sources/drains;

(m*n-p) channel nodes formed on said channel area, said (m*n-p) channel nodes including (m*n-p) channel;

a first insulating layer formed on said p first sources/drains, said p second sources/drains and said (m*n-p) channel;

a second insulating layer formed on said p gates; and n decoder inputs formed on said second insulating layer, said n decoder inputs electrically connected with said p gates by a plurality of contacts; wherein said p first sources/drains, said p second sources/drains and said (m*n-p) channel form m signal lines.

9. The decoder structure of claim 8, wherein said first insulating layer is an oxide layer.

* * * * *